United States Patent
Cho et al.

(10) Patent No.: US 8,053,730 B2
(45) Date of Patent: Nov. 8, 2011

(54) INFRARED SENSOR AND METHOD OF FABRICATING THE SAME

(75) Inventors: Seong Mok Cho, Daejeon (KR); Ho Jun Ryu, Seoul (KR); Woo Seok Yang, Daejeon (KR); Sang Hoon Cheon, Daejeon (KR); Byoung Gon Yu, Daejeon (KR); Chang Auk Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 177 days.

(21) Appl. No.: 12/511,251

(22) Filed: Jul. 29, 2009

(65) Prior Publication Data
US 2010/0155601 A1 Jun. 24, 2010

(30) Foreign Application Priority Data
Dec. 22, 2008 (KR) ........................ 10-2008-0131658

(51) Int. Cl.
*G01J 5/02* (2006.01)
(52) U.S. Cl. .................................. 250/338.1; 250/338.4
(58) Field of Classification Search ............... 250/338.1, 250/338.4
See application file for complete search history.

(56) References Cited

U.S. PATENT DOCUMENTS

| 6,137,107 | A  | * | 10/2000 | Hanson et al. ............... 250/332 |
| 6,426,539 | B1 |   | 7/2002  | Vilain et al. |
| 7,138,630 | B2 |   | 11/2006 | Vilain |
| 2007/0170363 | A1 | * | 7/2007 | Schimert et al. ............. 250/353 |

FOREIGN PATENT DOCUMENTS
JP     2003-329515     11/2003
* cited by examiner

*Primary Examiner* — Constantine Hannaher

(57) ABSTRACT

An infrared sensor and a method of fabricating the same are provided. The sensor includes a substrate including a reflection layer and a plurality of pad electrodes, an interdigitated sensing electrode connected to the pad electrode and formed to be spaced apart from the reflection layer by a predetermined distance and a sensing layer formed on the sensing electrode and having an opening exposing a portion in which an interdigitated region of the sensing electrode connected to one pad region is separated from the sensing electrode connected to the other pad electrode. Therefore, the sensor has an electrode in a very simple constitution, and a sensing layer divided into rectangular blocks, so that current that non-uniformly flows into the electrode can be removed. Accordingly, the sensor in which current of the sensing layer can be uniformly flown, and noise is lowered can be implemented.

13 Claims, 12 Drawing Sheets

110  100  200

INFRARED SENSOR AND METHOD OF FABRICATING THE SAME

CROSS-REFERENCE TO RELATED APPLICATION

This application claims priority to and the benefit of Korean Patent Application No. 10-2008-0131658, filed Dec. 22, 2008, the disclosure of which is incorporated herein by reference in its entirety.

BACKGROUND

1. Field of the Invention

The present invention relates to an infrared sensor and a method of fabricating the same. More specifically, the present invention relates to an infrared sensor having a sensor structure in which noise characteristics are improved, and a method of fabricating the same.

2. Discussion of Related Art

Basically, an uncooled infrared sensor senses a change in temperature of a sensor by absorbing incident infrared rays. Uncooled infrared sensors are classified into a bolometer type, a pyroelectric type and a thermopile type depending on a method of sensing a change in temperature. The bolometer-type infrared sensor operates by sensing a change in resistance of a sensor resistor according to temperature. Performance of the infrared sensor is ultimately determined by a signal-to-noise ratio, and the noise components mainly consist of Johnson noise and 1/f noise. The Johnson noise is influenced by resistance of a material, and the greater the resistance, the greater the noise. Therefore, in order to reduce the Johnson noise, it is required to design a material constituting the sensor to have a low resistance value. While causes producing the 1/f noise do not clearly appear in theory, the noise is in inverse proportion to frequency. Further, as the volume of the material constituting the sensor becomes greater, the 1/f noise is reduced, and the noise is in proportion to an applied voltage. Therefore, in order to minimize the 1/f noise, it is required to design an electrode structure to maximally utilize the volume of the material, and a portion in which current is non-uniformly supplied such as a cusp should not exist in the sensor.

In the bolometer-type infrared sensor, the most widely used sensing materials include a vanadium oxide ($VO_x$)-based material and an amorphous silicon-based material. In the case of the amorphous silicon-based material, its resistivity is great, and thus when electrodes are simply arranged in parallel, a resistance of the sensor may be too great. As a result, the sensor may have deteriorated characteristics due to Johnson noise caused by the great resistance. In order to overcome the problems, the resistance of the sensor should be lowered, and thus an interdigitated electrode 200 extending from a pad region 110 is used as shown in FIG. 1. However, when the interdigitated electrode 200 is used, there is an inefficiently used portion in a sensing layer 100, and the volume of the sensing layer 100 is inefficiently used. Therefore, there is much room to increase the noise.

Moreover, there is a cusp A vulnerable to the shape of the electrode 200, and non-uniform current around this portion causes 1/f noise to be increased.

SUMMARY OF THE INVENTION

The present invention is directed to an infrared sensor in which an interdigitated electrode is simply structurally changed, so that causes producing noise including a cusp are removed.

One aspect of the present invention provides a method of fabricating an infrared sensor including: forming a substrate including a read-out integrated circuit (ROIC) and a reflection layer; forming a sacrificial layer having an anchor region in a pad region on the substrate; forming a lower protection layer on the sacrificial layer; forming an interdigitated sensing electrode extending from the pad region on the lower protection layer; sequentially forming a sensing layer and an upper protection layer on the lower protection layer and the sensing electrode; patterning the lower protection layer, the sensing layer and the upper protection layer to form an opening exposing a portion in which an interdigitated portion of the sensing electrode extending from the pad region is separated from the sensing electrode extending from the other pad region; and removing the sacrificial layer.

The interdigitated region of the sensing electrode extending from one pad region and the sensing electrode extending from the other pad region may be patterned to be separated from each other by a minimum distance.

The sensing electrode may include a stem electrode extending from the pad region, and a plurality of branch electrodes extending from the stem electrode.

The sensing electrode may be patterned so that the branch electrode extending from one pad region is separated from the stem electrode extending from the other pad region by the minimum distance.

The opening of the sensing layer is formed as small as possible within a range enabling patterning using lithography on the minimum distance between the sensing electrodes.

The branch electrode extending from one pad region may be disposed to be interdigitated with the branch electrode of the other pad region.

The method may further include forming a contact hole in the lower protection layer to expose a pad electrode of the pad region in the anchor region of the sacrificial layer.

The method may further include forming an absorption layer under the lower protection layer or on the upper protection layer.

Another aspect of the present invention provides an infrared sensor including: a substrate including a reflection layer and a plurality of pad electrodes; an interdigitated sensing electrode connected to the pad electrode and formed on the reflection layer to be spaced a predetermined distance therefrom; and a sensing layer formed on the sensing electrode and having an opening exposing a portion in which an interdigitated region of the sensing electrode connected to one pad electrode is separated from the sensing electrode connected to the other pad electrode.

The infrared sensor may further include a lower protection layer formed under the sensing electrode and an upper protection layer formed on the sensing layer.

The interdigitated region of the sensing electrode connected to one pad electrode may be separated from the sensing electrode connected to the other pad electrode by a minimum distance.

The sensing electrode may include a stem electrode extending from the pad electrode, and a plurality of branch electrodes extending from the stem electrode.

The branch electrode extending from the pad electrode may be separated from the stem electrode extending from the other pad electrode by the minimum distance in the sensing electrode.

The branch electrode extending from one pad electrode may be disposed to be interdigitated with the branch electrode extending from the other pad electrode.

The opening may be formed as small as possible within a range enabling patterning using lithography on the minimum distance between the sensing electrodes.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will be described more fully hereinafter with reference to the accompanying drawings, in which exemplary embodiments of the invention are shown. This invention may, however, be embodied in different forms and should not be construed as limited to the embodiments set forth herein.

Figure 2A:
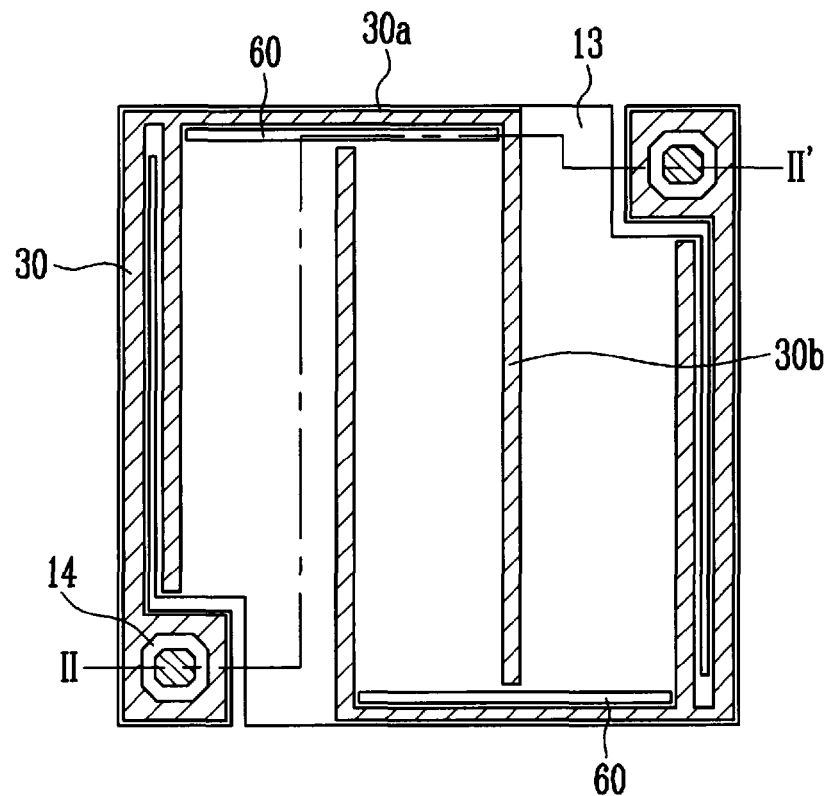
FIG. 2A is a plan view of an infrared sensor according to an exemplary embodiment of the present invention.
Figure 2B:
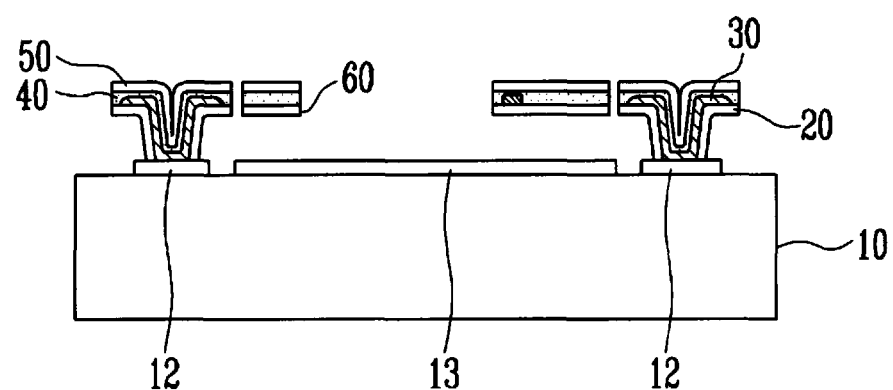
FIG. 2B is a cross-sectional view of the infrared sensor according to an exemplary embodiment of the present invention.

FIG. 2A is a plan view of an infrared sensor according to an exemplary embodiment of the present invention, and FIG. 2B is a cross-sectional view taken along line II-II' of FIG. 2A.

Referring to FIGS. 2A and 2B, the reflection layer 13 is formed on a substrate 10 on which a read-out integrated circuit (ROIC) is formed, and a pad electrode 12 connected to the ROIC of the substrate 10 is formed on the same layer as the reflection layer 13.

A lower protection layer 20, a sensing layer 40, and an upper protection layer 50 are sequentially stacked on the reflection layer 13 to be spaced a predetermined distance therefrom.

Such a stacked structure is bent at a portion of the pad electrode 12 to form an anchor, which is thus spaced apart from the pad electrode 12 by the predetermined distance.

An interdigitated electrode 30 connected to the pad electrode 12 and extending from a portion connected to the pad electrode 12 is formed between the lower protection layer 20 and the sensing layer 40.

Specifically describing such an electrode 30, there are two pad regions at corners diagonally facing each other in a sensor (in the shape of a rectangular frame), and the electrode 30 is in contact with the pad electrode 12 in each pad region and extends therefrom. The interdigitated electrode 30 includes a stem electrode 30a extending right and left and a plurality of branch electrodes 30b extending straight from the stem electrode 30a upward and downward. One of the plurality of branch electrodes 30b extends from the pad region and is connected to the pad electrode 12 at a lower portion to transmit a sensing signal to the ROIC.

The branch electrodes 30b of the interdigitated electrode 30 that are respectively connected to the two pad regions are interdigitated with each other to divide one frame into a plurality of sections. Such an electrode 30b maximally extends and is formed to be spaced apart from the stem electrode 30a of the other interdigitated electrode 30 by a minimum distance, so that a cusp is not formed. In order to form an opening 60 pattern in a subsequent process between the interdigitated electrode 30 and the stem electrode 30a, a minimum distance is needed and the distance may be maintained at a necessary minimum distance enabling the opening 60 to be formed by lithography.

Here, since the opening 60 on which the sensing layer 40 is removed is formed on a region formed to be spaced by the minimum distance, the branch electrode 30b is completely insulated from the stem electrode 30a of the other interdigitated electrode 30. The opening 60 may be formed by removing the sensing layer 40 or layers disposed thereon, and may be formed by removing other layers including a lower protection layer below the sensing layer. After the lower protection layer 20 is removed from the pad region, the electrode 30 is in direct contact with the pad electrode 12.

As described above, the interdigitated electrode 30 is formed to be maximally stretched, a cusp is removed from a region that is connected to the other sensing electrode 30, and the sensing layer 40 in a region to which the sensing electrode 30 does not extend is removed, so that a sensor in which noise is reduced can be fabricated.

Such an infrared sensor may further include an absorption layer for an infrared absorption structure, and the absorption layer may be arbitrarily added. For example, the absorption layer may be formed when the lower protection layer 20 is formed or the upper protection layer 50 is formed. When the absorption layer is formed in forming the upper protection layer 50, a pattern should be formed on the absorption layer to correspond to the opening 60 pattern of the sensing layer 40 as shown in FIG. 2A. Alternatively, when the absorption layer is added when the lower protection layer 20 is formed, such an opening as the opening 60 of the sensing layer 40 may not be formed on the absorption layer.

When the absorption layer is added when the lower protection layer is formed, and no opening is formed on the absorption layer, the opening 60 etching is stopped at the absorption layer. A method of fabricating an infrared sensor according to the present invention will be described below with reference to FIGS. 3A to 11B.

Figure 3A:
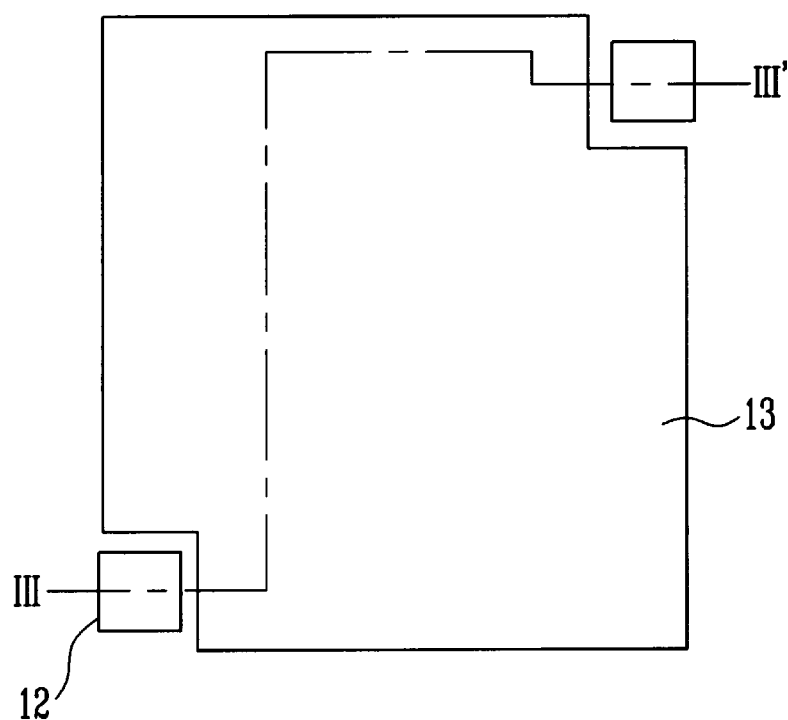
FIGS. 3A to 11B are plan and cross-sectional views illustrating a method of fabricating the infrared sensor shown in FIGS. 2A and 2B.
Figure 3B:
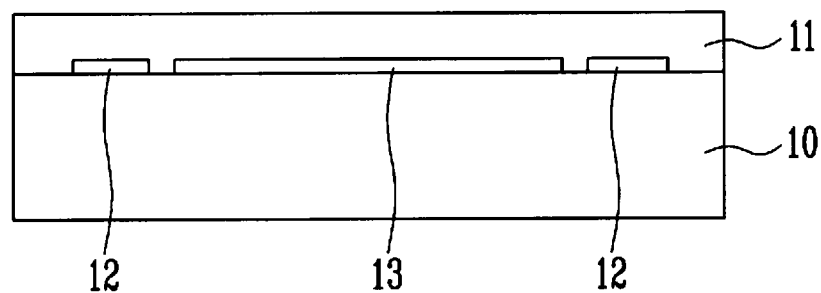

As shown in FIGS. 3A and 3B, a metal thin film used as a reflection layer 13 and made of aluminum is deposited on a substrate 10 including a ROIC, and is patterned to form the reflection layer 13 and a pad electrode 12.

The pad electrode 12 transmits a sensing signal from a sensing electrode 30 to the ROIC, and corresponds to aluminum metal of a pad region in each diagonally arranged edge of the rectangular-shaped sensor.

Afterwards, a sacrificial layer 11 covering the reflection layer 13 and the pad electrode 12 and having a predetermined thickness is formed.

The sacrificial layer 11 is mainly formed of a polyimide-based organic material, and may be formed of a silicon oxide layer or a polysilicon or amorphous silicon layer as necessary. The thickness of the sacrificial layer 11 may vary depending on a wavelength applied to the sensor. For example, to achieve operation at a wavelength of 10 μm, a thickness within 2 μm is preferable.

Figure 4A:
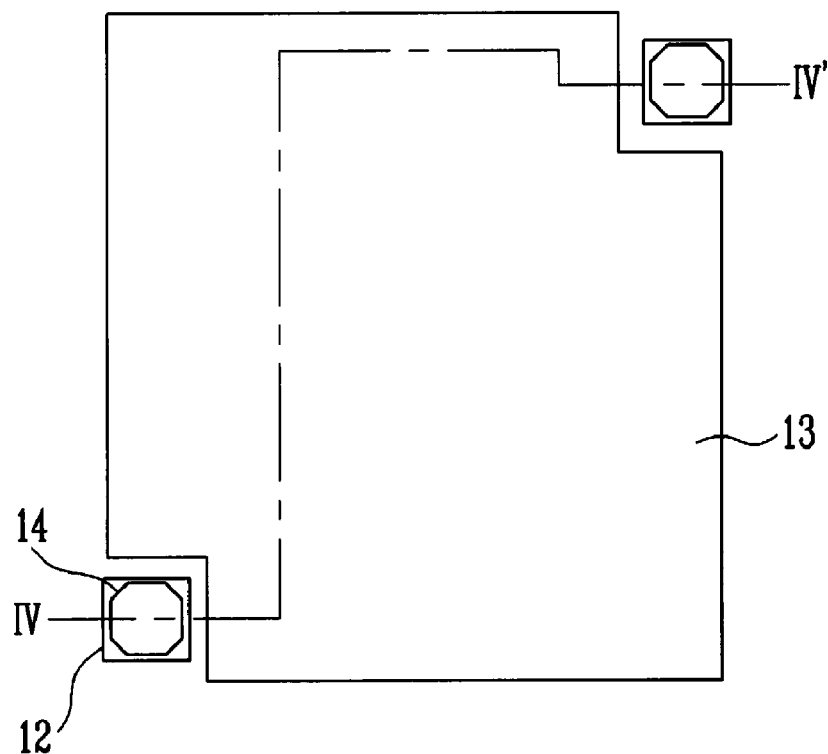
Figure 4B:
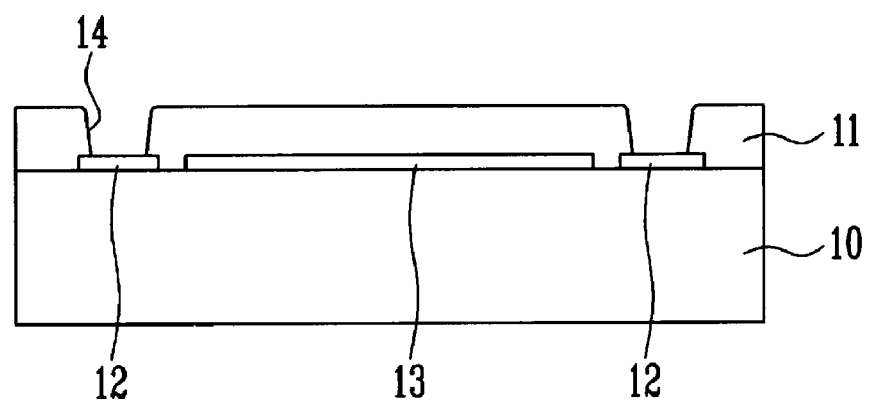

After the sacrificial layer 11 is formed, as shown in FIGS. 4A and 4B, an anchor 14 functioning as a supporter between the substrate 10 and an upper structure is formed by patterning the anchor to expose the pad electrode 12.

Figure 5A:
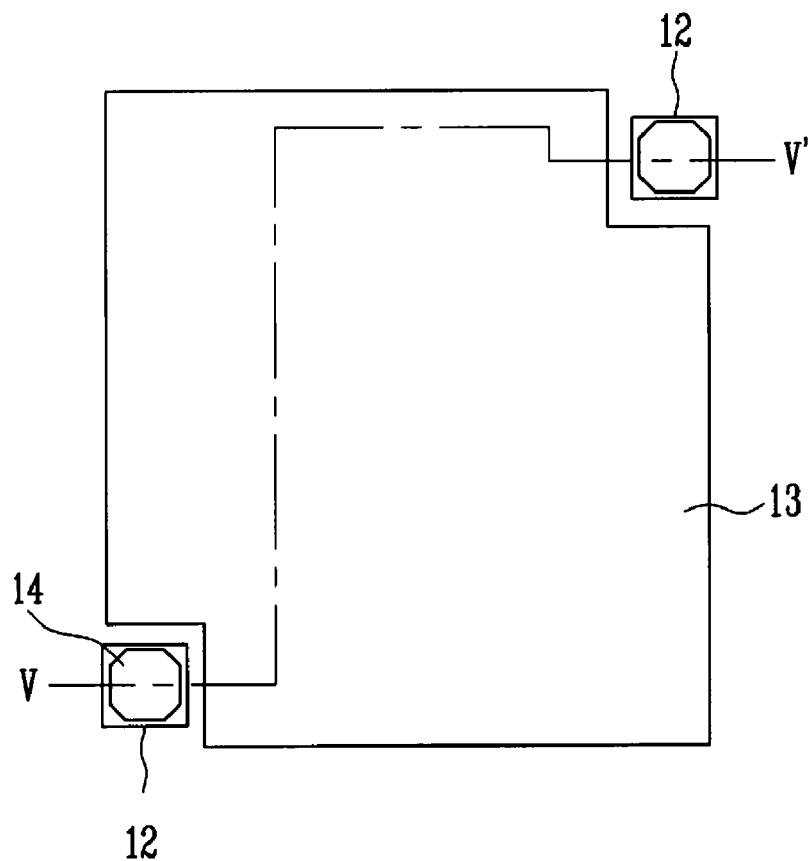
Figure 5B:
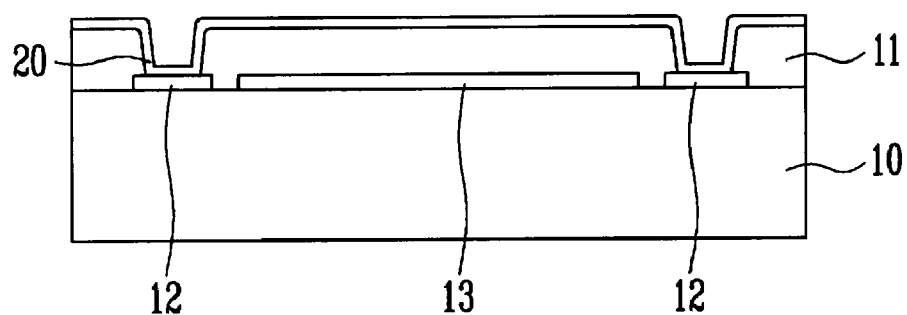

After forming the anchor 14 pattern, a lower protection layer 20 shown in FIGS. 5A and 5B is deposited on the entire surface of the sacrificial layer 11.

The lower protection layer 20 may be formed of a silicon nitride layer or a silicon oxide layer, and the deposition may be performed by chemical vapor deposition (CVD) exhibiting excellent deposition uniformity in a step difference region.

Figure 6A:
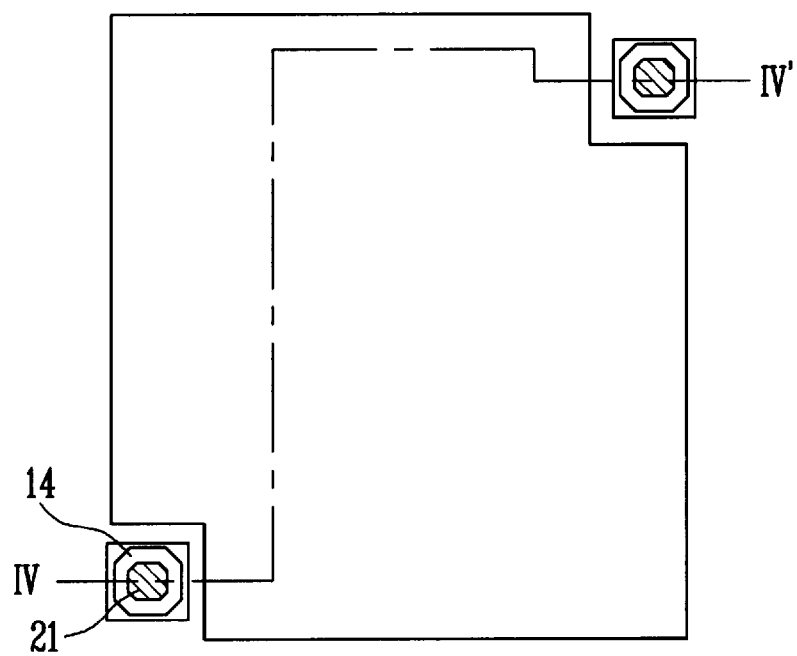
Figure 6B:
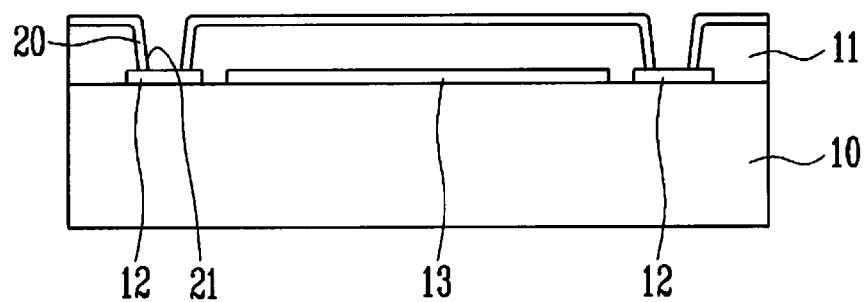

As shown in FIGS. 6A and 6B, after depositing the lower protection layer 20, a contact hole 21 for electrical connection with the ROIC is formed in the lower protection layer 20 that is disposed on a lower surface of the anchor 14 to expose the pad electrode 12.

Figure 7A:
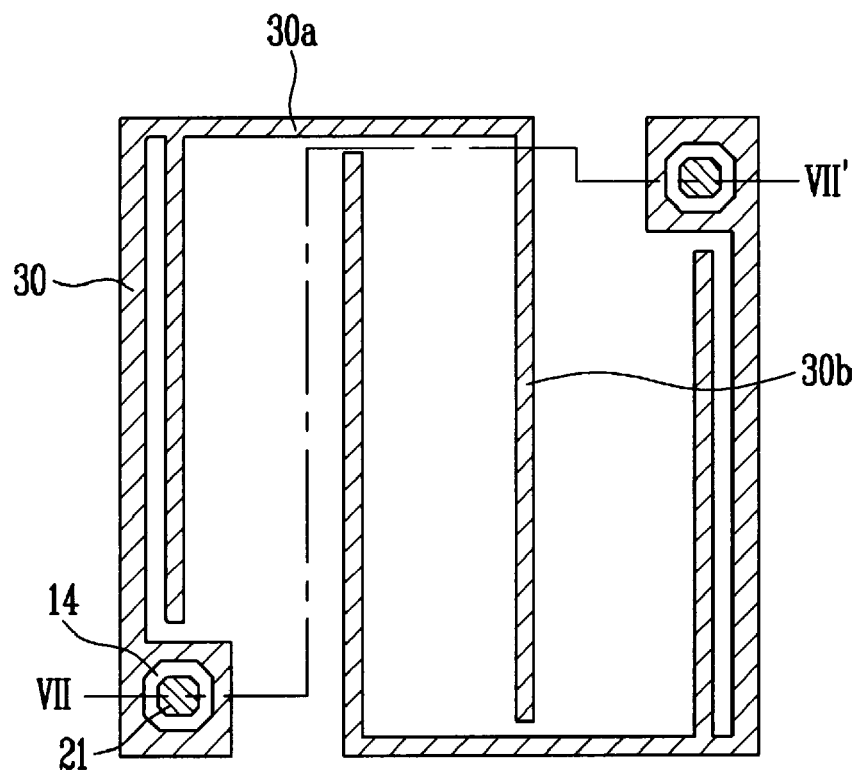
Figure 7B:
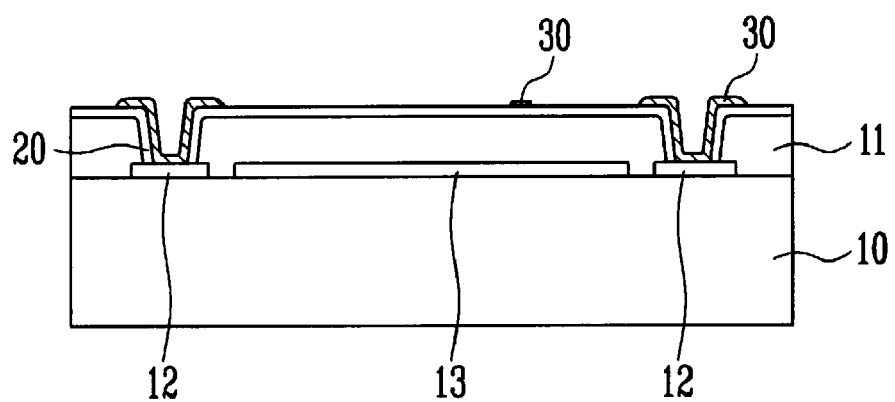

Afterwards, a metal such as Ni—Cr, Ti, or TiN is deposited on the entire surface of the lower protection layer 20 having a support arm structure, and an interdigitated electrode 30 is formed as shown in FIG. 7A. In the plan views of FIGS. 7A to 12A, a reflection layer pattern is omitted for clarity. The sensing electrode 30 includes a branch electrode 30a extending from a pad region upward and downward and a stem electrode 30b that connects the branch electrodes 30a to each other as shown in FIG. 2A.

Here, as shown in FIG. 7A, the branch electrode 30a extending from a pad region is patterned to stretch and to be spaced apart from the stem electrode 30b of the other pad region that is electrically separated and faces each other by a minimum distance. The minimum distance refers to a distance for performing lithography on a region formed to be spaced by the distance in the subsequent process so that an opening 60 of FIG. 10A can be patterned.

Figure 1:
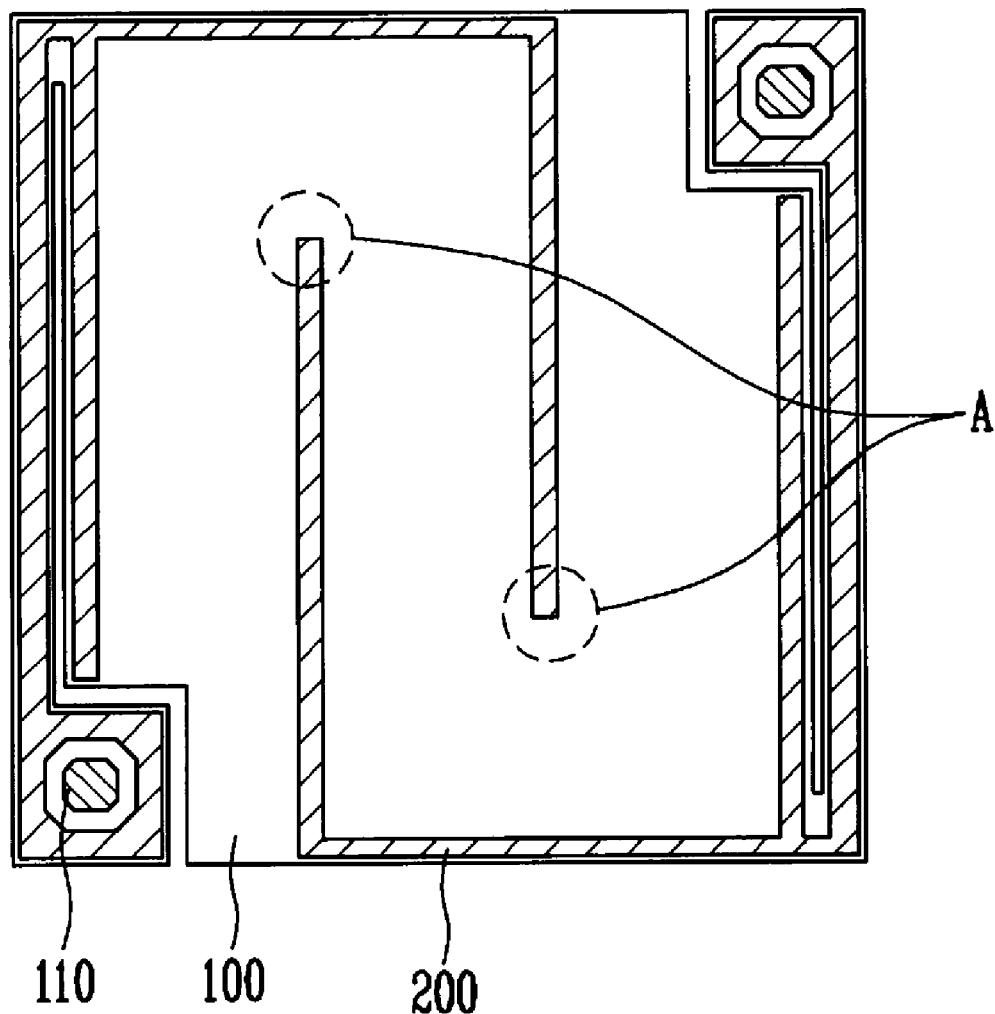
FIG. 1 is a plan view illustrating a structure of a conventional MEMS type infrared sensor.

Therefore, a cusp of the sensing electrode shown in FIG. 1 is not formed.

Since the anchor pattern causes a significant step difference, when the thin electrode 30 is insufficient for interconnection reliability of the pad region, metal deposition and patterning processes for the interconnection may be additionally performed on the pad region in order to smoothly connect the interconnections.

Figure 8A:
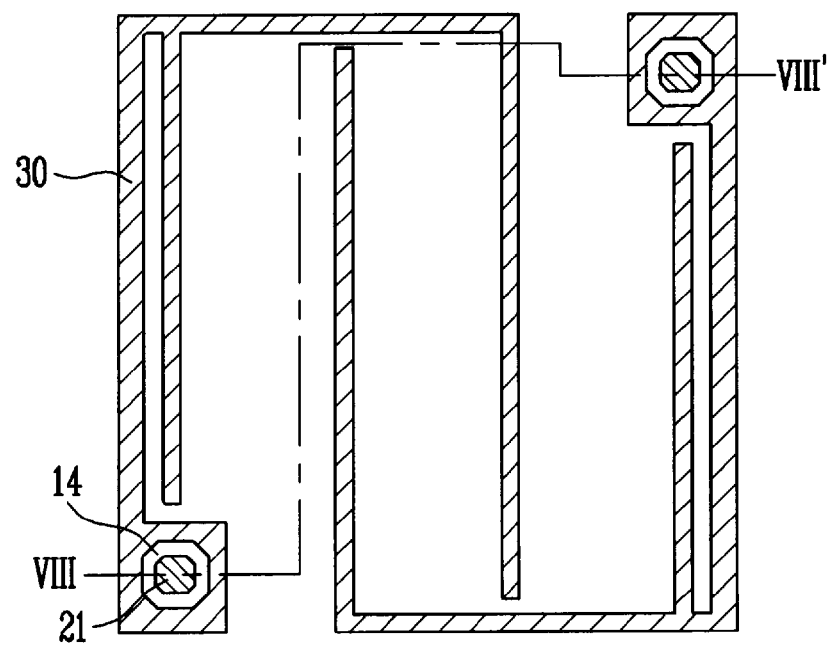
Figure 8B:
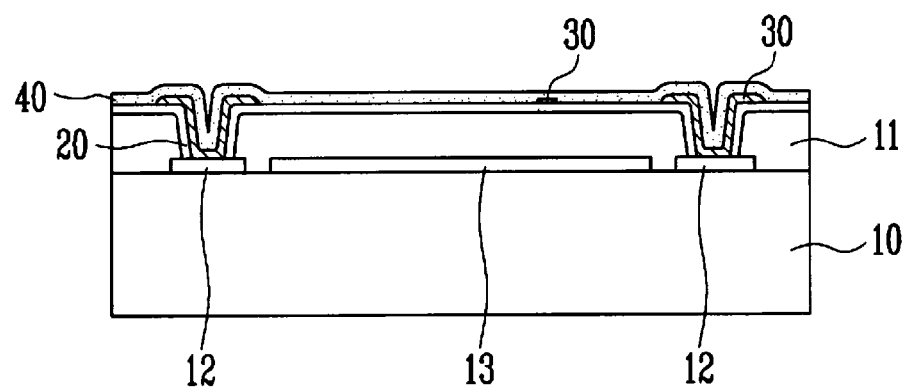

Then, as shown in FIGS. 8A and 8B, a sensing layer 40 is deposited on the entire surface of a frame. The sensing layer 40 may be formed of materials such as amorphous silicon, polysilicon, vanadium oxide layer, etc., and as the temperature of a sensor is changed by absorbing sensed infrared rays, its resistance is changed.

Figure 9A:
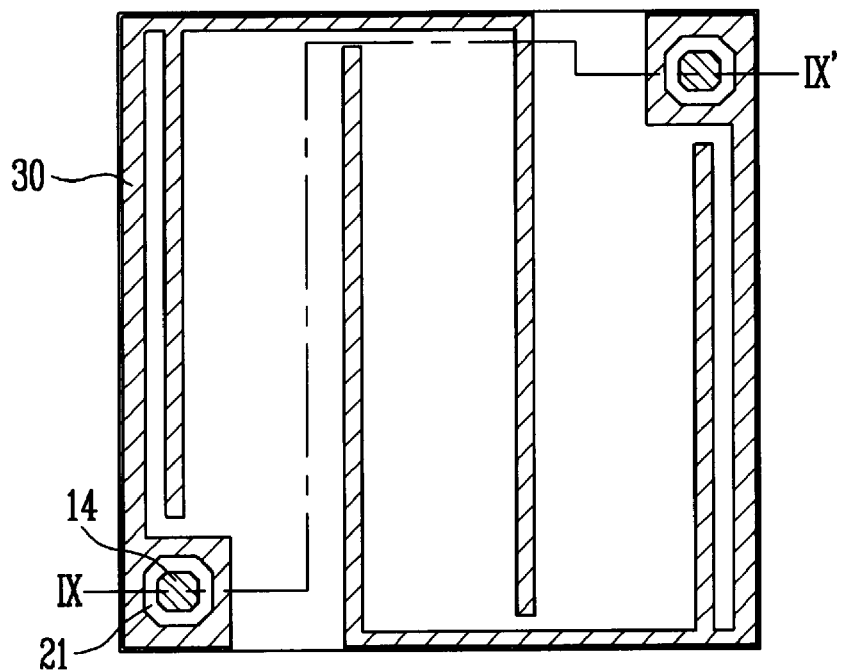
Figure 9B:
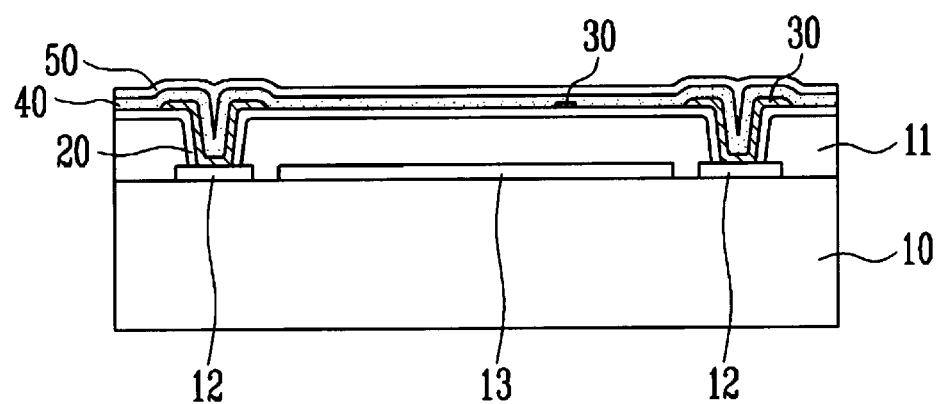

As shown in FIGS. 9A and 9B, an upper protection layer 50 is deposited on the entire surface of the sensing layer 40, and the upper protection layer 50 may be formed of a silicon nitride layer or a silicon oxide layer.

Figure 10A:
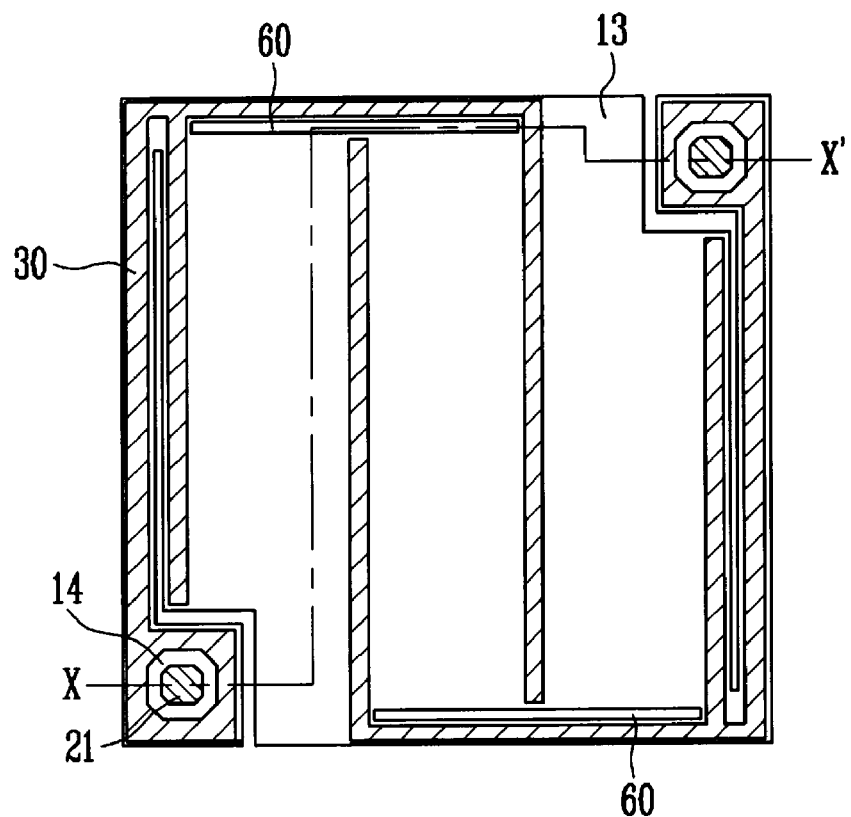
Figure 10B:
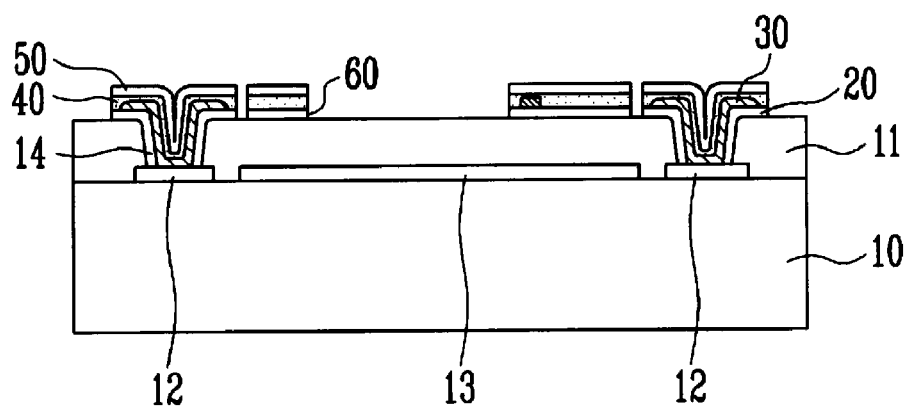

Afterwards, as shown in FIGS. 10A and 10B, the upper protection layer 50, the sensing layer 40, and the lower protection layer 20 that are formed on a region in which the stem electrode 30a connected to a pad region faces the branch electrode 30b connected to the other pad region to be spaced the distance therefrom are removed to form an opening 60 exposing a sacrificial layer 11. In the process of forming the opening 60, the lower protection layer 20 may not be removed.

As described above, the opening 60 of the removed sensing layer 40 does not function as a sensor, and thus may be formed as small as possible within a range enabling lithography taking into account performance of the sensor. That is, the opening 60 may be formed as small as possible, and may be formed to a width at which it can be sufficiently electrically insulated. Since the opening does not function as a sensor, when it is formed larger than needed, an area functioning as a sensor is reduced, and thus this may have a negative effect on performance of the sensor.

Figure 11A:
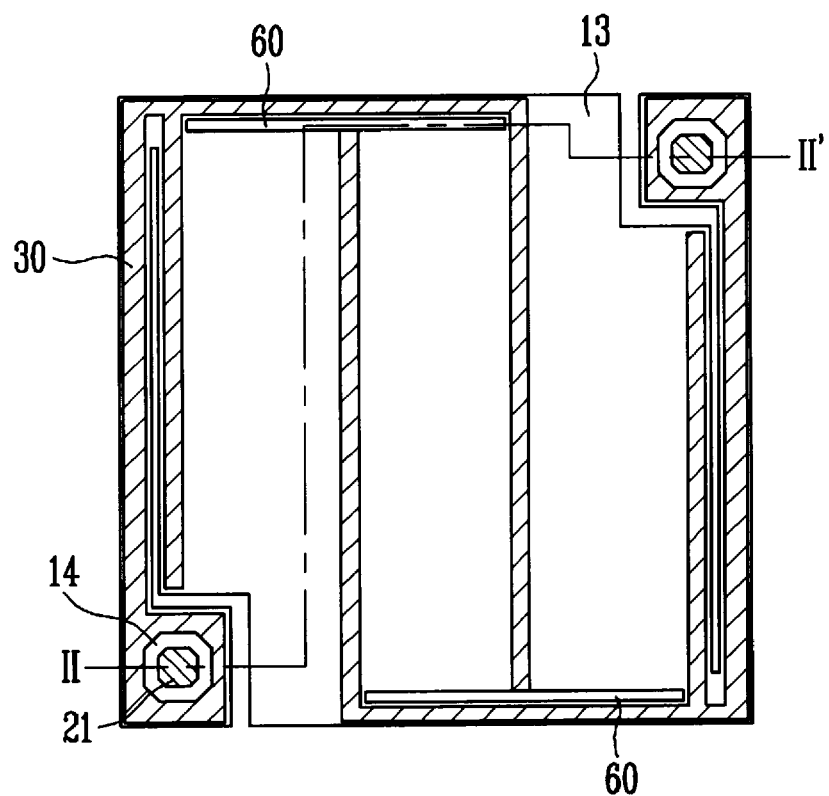
Figure 11B:
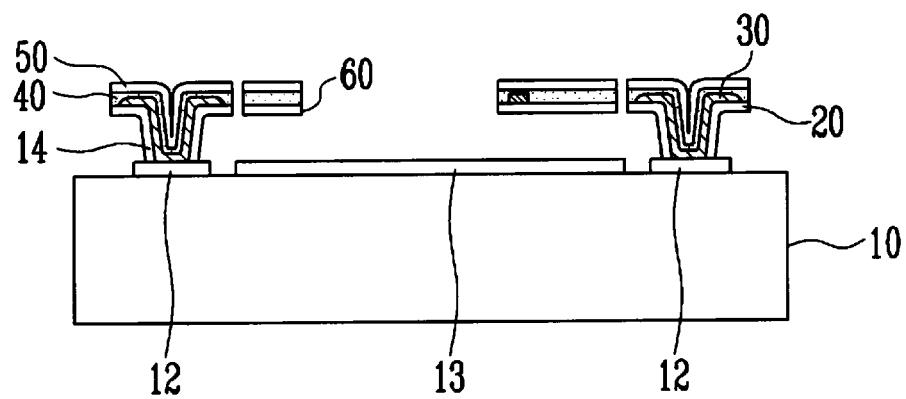

Then, as shown in FIGS. 11A and 11B, the sacrificial layer 11 is removed using oxygen plasma, so that a MEMS type infrared sensor having an upper structure facing a reflection layer 13 to be spaced therefrom by a predetermined distance is formed.

Figure 12:
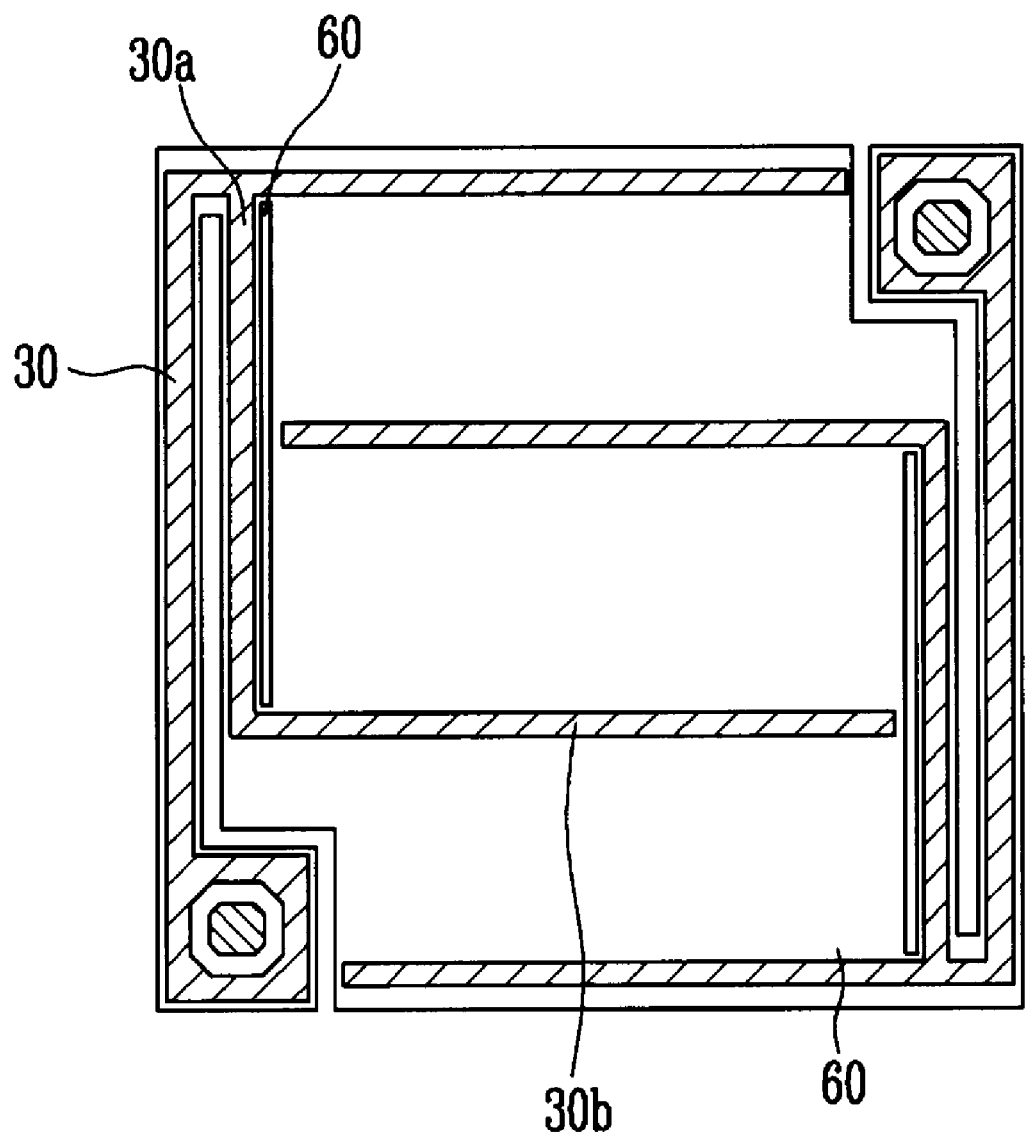
FIG. 12 is a plan view of an infrared sensor according to another exemplary embodiment of the present invention.

As shown in FIG. 12, a sensing electrode of the infrared sensor may be patterned to have a stem electrode 30a extending upward and downward from a pad region and a branch electrode 30b extending right and left from the stem electrode 30a. Since the sensor of FIG. 12A is the same as the sensor shown in FIG. 2A in terms of structure, even though it is different in a direction in which an electrode is illustrated, it may be fabricated by the process described with reference to FIGS. 3A to 11B.

While it is described that the electrode 30 is in the shape dividing the sensing layer 40 into three blocks, when resistivity of the sensor is great, the electrode may divide the sensing layer 40 into more blocks in order to lower resistance of the sensor, i.e., an interdigitated electrode having more electrodes may be formed.

According to the present invention, a sensor in which an electrode has a very simple constitution, a sensing layer is divided into rectangular blocks by the electrode and the layer pattern, so that current that non-uniformly flows into the electrode is removed, and thus current of the sensing layer uniformly flows and noise is low can be implemented. Further, a resistance value of the sensing layer can be lowered, so that Johnson noise is efficiently reduced. Moreover, compared with the conventional sensor structure, additional processes are not required, and thus fabrication can be accomplished with simple processes.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of fabricating an infrared sensor, comprising:
forming a substrate including a read-out integrated circuit (ROIC);
forming first and second pad electrodes over the substrate so as to be coupled to the ROIC;
forming a reflection layer over the substrate between the first and the second pad electrodes;
forming a sacrificial layer over the reflection layer so as to expose the first and the second pad electrodes;
forming a lower protection layer over the sacrificial layer so as to be coupled to the first and the second pad electrodes;
forming a first sensing electrode and a second sensing electrode over the reflection layer,
forming a sensing layer over the first and the second sensing electrodes and the reflection layer; and
forming a first opening and a second opening each passing through the sensing layer,
wherein a first end of the first sensing electrode is coupled to the first pad electrode, and a first end of the second sensing electrode is coupled to the second pad electrode,
wherein a second end of the first sensing electrode and a second end of the second sensing electrode are configured to be interdigitated to each other,
wherein the first opening is formed between the first sensing electrode arranged along a first direction and the second end of the second sensing electrode arranged along a second direction different from the first direction, and wherein the second opening is formed between the second sensing electrode arranged along a third direction and the second end of the first sensing electrode arranged along a fourth direction different from the third direction.

2. The method of claim 1,
wherein the first sensing electrode includes a first body electrode extending from the first end of the first sensing electrode, a first stem electrode extending from the first body electrode, and a first branch electrode extending between the first stem electrode and the second end of the first sensing electrode, and
wherein the second sensing electrode includes a second body electrode extending from the first end of the second sensing electrode, a second stem electrode extending from the second body electrode, and a second branch electrode extending between the second stem electrode and the second end of the first sensing electrode.

3. The method of claim 2, wherein the first opening is formed between the first stem electrode and the second branch electrode, and
wherein the second opening is formed between the second stem electrode and the first branch electrode.

4. The method of claim 3, wherein the first and the second openings are formed using a lithography process, and
wherein the first and the second openings are configured to have minimum sizes obtainable by the lithography process.

5. The method of claim 4, wherein the first branch electrode and the second branch electrode are interdigitated to each other by extending toward the second stem electrode and the first stem electrode, respectively.

6. The method of claim 5, further comprising
patterning the lower protection layer under the sacrificial layer to expose the first and the second pad electrodes.

7. The method of claim 5, further comprising
forming an absorption layer between the lower protection layer and any of the first and the second pad electrodes.

8. An infrared sensor comprising:
a first pad electrode and a second pad electrode each formed over a substrate;
a reflection layer formed over the substrate between the first and the second pad electrodes;
a first sensing electrode and a second sensing electrode formed over the reflection layer,
a sensing layer formed over the first and the second sensing electrodes and the reflection layer; and
a first opening and a second opening each passing through the sensing layer,
wherein a first end of the first sensing electrode is coupled to the first pad electrode, and a first end of the second sensing electrode is coupled to the second pad electrode,
wherein a second end of the first sensing electrode and a second end of the second sensing electrode are configured to be interdigitated to each other,
wherein the first opening is formed between the first sensing electrode arranged along a first direction and the second end of the second sensing electrode arranged along a second direction different from the first direction, and
wherein the second opening is formed between the second sensing electrode arranged along a third direction and the second end of the first sensing electrode arranged along a fourth direction different from the third direction.

9. The sensor of claim 8, further comprising:
a lower protection layer formed between the first sensing electrode and the reflection layer and between the second sensing electrode and the reflection layer; and
an upper protection layer formed over the sensing layer.

10. The sensor of claim 8, wherein the first sensing electrode includes a first body electrode extending from the first end of the first sensing electrode, a first stem electrode extending from the first body electrode, and a first branch electrode extending between the first stem electrode and the second end of the first sensing electrode, and
wherein the second sensing electrode includes a second body electrode extending from the first end of the second sensing electrode, a second stem electrode extending from the second body electrode, and a second branch electrode extending between the second stem electrode and the second end of the first sensing electrode.

11. The sensor of claim 10, wherein the first opening is formed between the first stem electrode and the second branch electrode, and
wherein the second opening is formed between the second stem electrode and the first branch electrode.

12. The sensor of claim 11, wherein the first and the second openings are formed using a lithography process, and
wherein the first and the second openings are configured to have minimum sizes obtainable by the lithography process.

13. The sensor of claim 10, wherein the first branch electrode and the second branch electrode are interdigitated to each other by extending toward the second stem electrode and the first stem electrode, respectively.

* * * * *